(12) United States Patent
Sakurai et al.

(10) Patent No.: US 7,814,919 B2
(45) Date of Patent: Oct. 19, 2010

(54) ULTRASONIC CLEANING APPARATUS

(75) Inventors: Naoaki Sakurai, Yokohama (JP); Hiroshi Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/248,514

(22) Filed: Oct. 9, 2008

(65) Prior Publication Data

US 2009/0044844 A1 Feb. 19, 2009

Related U.S. Application Data

(63) Continuation of application No. 11/870,272, filed on Oct. 10, 2007, now abandoned, which is a continuation of application No. 11/159,199, filed on Jun. 23, 2005, now abandoned.

(30) Foreign Application Priority Data

Jun. 24, 2004 (JP) .............................. 2004-186500

(51) Int. Cl.
*B08B 3/12* (2006.01)
*B08B 6/00* (2006.01)
(52) U.S. Cl. ..................... 134/201; 134/902
(58) Field of Classification Search .................. None
See application file for complete search history.

(56) References Cited

U.S. PATENT DOCUMENTS

| | | | | |
|---|---|---|---|---|
| 2,770,795 A | * | 11/1956 | Peterson | 367/91 |
| 3,421,939 A | * | 1/1969 | Jacke | 134/1 |
| 5,078,149 A | | 1/1992 | Katsumata et al. | |
| 6,463,938 B2 | | 10/2002 | Bran | |
| 6,536,452 B1 | | 3/2003 | Kohama et al. | |
| 6,875,696 B2 | | 4/2005 | Sakurai et al. | |
| 2003/0024547 A1 | | 2/2003 | Bran et al. | |
| 2004/0054288 A1 | | 3/2004 | Nygaard | |

FOREIGN PATENT DOCUMENTS

| | | |
|---|---|---|
| JP | 08-141528 | 6/1996 |
| JP | 2000-508237 | 7/2000 |
| JP | 2002-86068 | 3/2002 |
| JP | 2003-31540 | 1/2003 |
| JP | 2003-297787 | 10/2003 |
| WO | WO2005/030407 | 4/2005 |

* cited by examiner

*Primary Examiner*—Michael Barr
*Assistant Examiner*—David Cormier
(74) *Attorney, Agent, or Firm*—Oblon, Spivak, McClelland, Maier & Neustadt, L.L.P.

(57) ABSTRACT

An ultrasonic cleaning apparatus which cleans a material at a surface by supplying an ultrasonic wave from an ultrasonic wave application head to a cleaning liquid on the surface, and cleans the surface, wherein the ultrasonic wave application head has an ultrasonic wave transmission member which is provided opposite the surface, and has a curved portion on a first plane placed close to the surface, an ultrasonic transducer which is provided on a second plane placed opposite the first plane of the ultrasonic wave transmission member, and generates and applies an ultrasonic wave to a cleaning liquid on the surface through the ultrasonic wave transmission member, and a preventive portion which is provided in the ultrasonic wave transmission member, and prevents the ultrasonic wave applied to the cleaning liquid and reflected on the surface from entering the ultrasonic transducer through the ultrasonic wave transmission member.

4 Claims, 6 Drawing Sheets

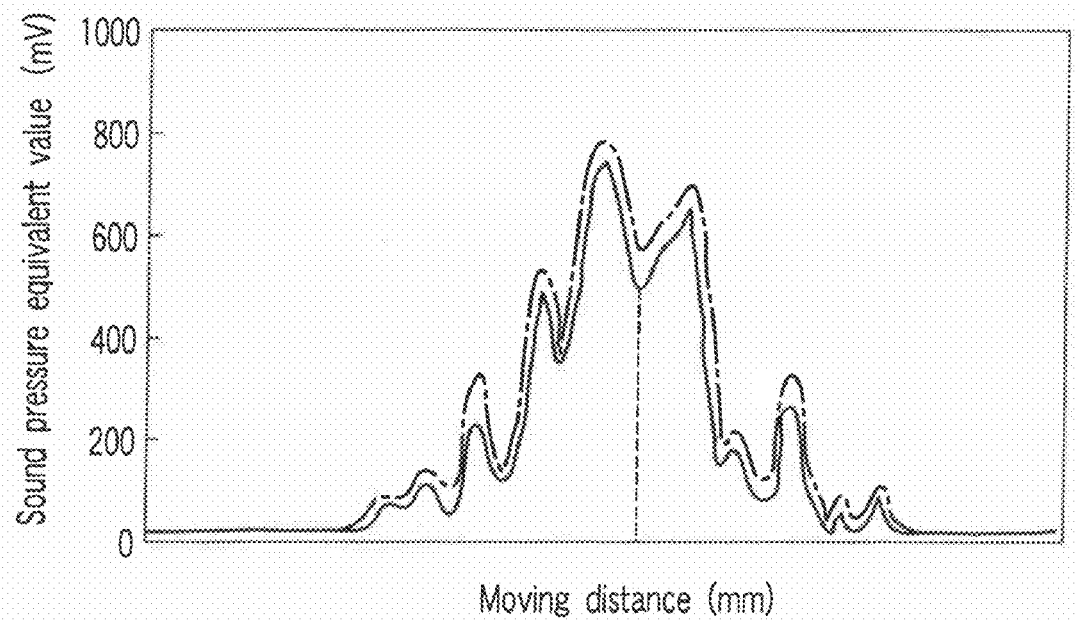
F I G. 3A
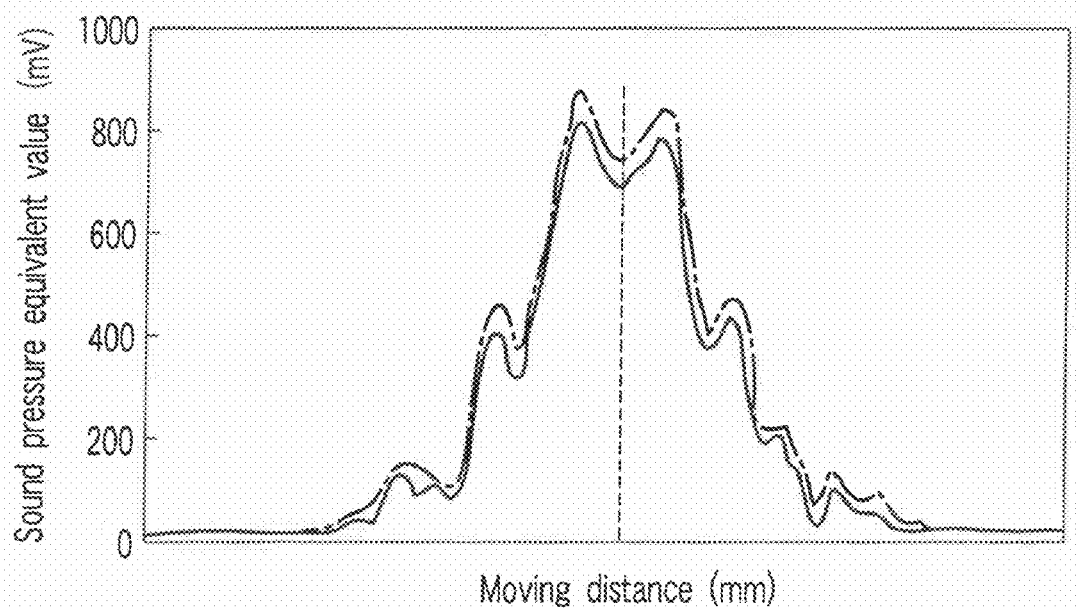
F I G. 3B

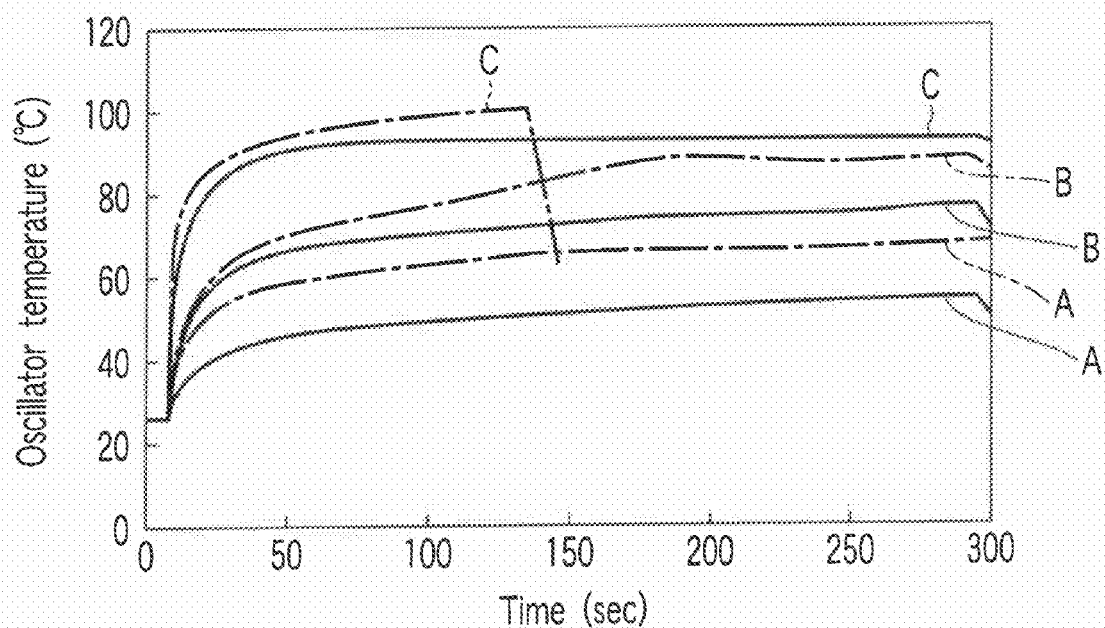
F I G. 5
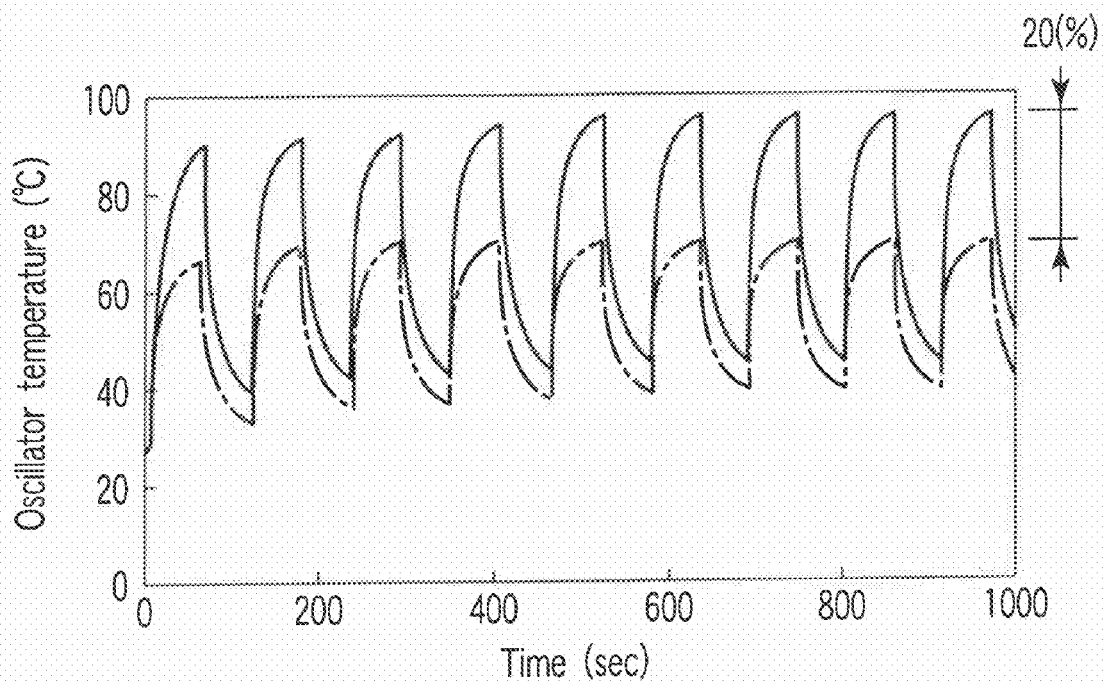
F I G. 6

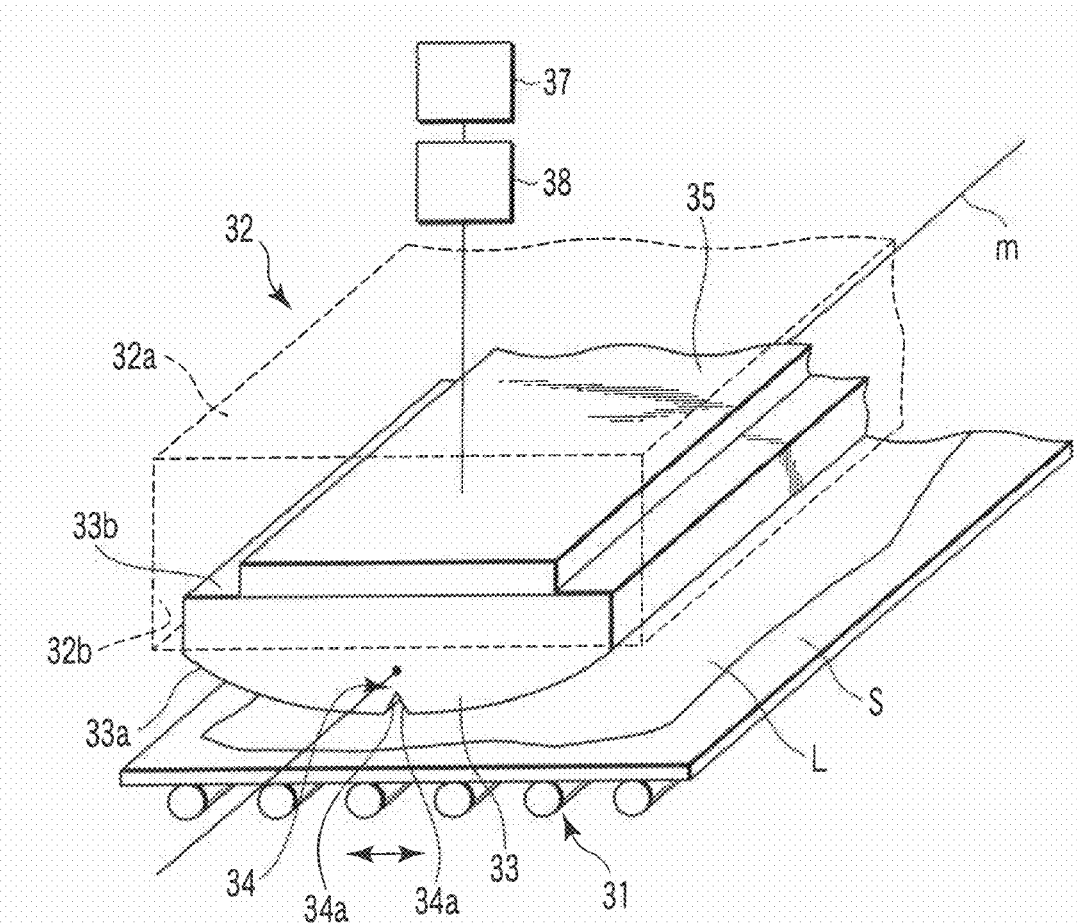
F I G. 9
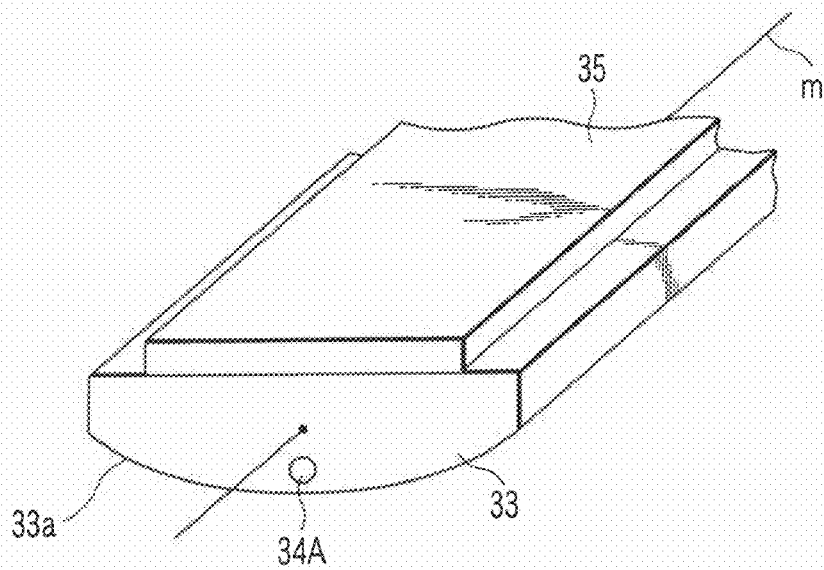
F I G. 10

ULTRASONIC CLEANING APPARATUS

CROSS-REFERENCE TO RELATED APPLICATIONS

This application is a continuation of and claims the benefit of priority under 35 U.S.C. §120 from U.S. application Ser. No. 11/870,272, filed Oct. 10, 2007, which is a continuation of U.S. application Ser. No. 11/159,199, filed Jun. 23, 2005, and claims the benefit of priority under 35 U.S.C. §119 of Japanese Patent Application No. 2004-186500, filed Jun. 24, 2004, the entire contents of each are incorporated herein by reference.

BACKGROUND OF THE INVENTION

1. Field of the Invention

The present invention relates to an ultrasonic cleaning apparatus for cleaning materials such as a semiconductor substrate and glass substrate at a surface by using ultrasonic waves.

2. Description of the Related Art

A process of manufacturing substrates such as semiconductor substrate and glass substrate includes a cleaning step of eliminating particles adhering to the surface of a substrate. In this cleaning step, an ultrasonic cleaning apparatus is used, which eliminates particles adhering to the surface of the substrate by applying an ultrasonic wave to a cleaning liquid.

Generally, a nozzle type and a slit type are known as an ultrasonic cleaning apparatus. A nozzle type ultrasonic cleaning apparatus cleans a material at a surface while rotating the material on a rotary table, and has a cylindrical cleaning head provided substantially vertical in the upper surface side of the material.

A slit type ultrasonic cleaning apparatus cleans a material at a surface while conveying the material by a conveying unit such as rollers, and has a bar-shaped cleaning head provided horizontally in the upper surface side of the material, so as to cross the material conveying direction.

These cleaning heads has a liquid chamber inside to store a cleaning liquid, a nozzle or slit on the lower surface to eject the cleaning liquid, and an ultrasonic transducer outside the upper surface to apply an ultrasonic wave to the cleaning liquid in the cleaning chamber.

In the ultrasonic cleaning apparatus configured as above has an ultrasonic transducer on the upper surface of the cleaning head, and it is necessary to keep the liquid chamber filled with a cleaning liquid to apply an ultrasonic wave generated by the ultrasonic transducer to the cleaning liquid. Further, it is necessary to keep the liquid chamber filled with a cleaning liquid to prevent deterioration of the ultrasonic transducer by heat.

However, if the liquid chamber is filled with a cleaning liquid, the cleaning liquid more than the necessary quantity is ejected from the nozzle or slit and much cleaning liquid is wasted.

To solve the above problem, an ultrasonic cleaning apparatus has been developed in recent years, (Jpn. Pat. Appln. KOKAI Publication No. 2003-31540).

The ultrasonic cleaning apparatus supplies a cleaning liquid to an upper surface of a material to be cleaned, and applies an ultrasonic wave to the cleaning liquid on the upper surface of the material.

The ultrasonic cleaning apparatus has a cylindrical ultrasonic wave application head. The ultrasonic wave application head is provided substantially vertical to the upper surface of the material, and has an ultrasonic lens as a diffusion application means at the lower end, an ultrasonic transducer to generate an ultrasonic wave inside, and a nozzle to supply a cleaning liquid to the upper surface of a material outside.

The ultrasonic lens transmits the ultrasonic wave generated by the ultrasonic transducer to the cleaning liquid on the upper surface of the material, and has inside a path to flow a cooling liquid to cool the ultrasonic transducer. The lower surface of the ultrasonic lens is curved to swell toward the upper surface of the material to diffuse and apply the ultrasonic wave generated by the ultrasonic transducer to a wide area of the cleaning liquid.

According to the ultrasonic cleaning apparatus configured as above, ultrasonic wave is applied directly from the ultrasonic lens to the cleaning liquid supplied to the surface of the material. Therefore, the material can be cleaned with the least minimum cleaning liquid, and the amount of the cleaning liquid with which the material is cleaned can be decreased. Further, the ultrasonic transducer can be cooled by flowing a cooling liquid in the path provided in the ultrasonic lens.

As an ultrasonic cleaning apparatus of the type similar to the above, there is a known ultrasonic cleaning apparatus, in which a cylindrical ultrasonic lens is provided parallel or substantially parallel to a material to be cleaned.

One end of the ultrasonic lens is expanded in the diameter, and the expanded end face has a block made of material with high thermal conductivity such as copper. A path to flow a cooling liquid is formed inside the block, and an ultrasonic transducer is provided on the outside surface of the block.

In this ultrasonic cleaning apparatus, an ultrasonic wave generated by the ultrasonic transducer is transmitted to the ultrasonic lens through the block, and vibrates the ultrasonic lens laterally or in the direction crossing the axial line. This lateral vibration is transmitted to the cleaning liquid between the ultrasonic lens and the material, and used to clean the material at an upper surface.

However, if an ultrasonic wave is applied to a cleaning liquid by using an ultrasonic lens as described above, an ultrasonic wave generated by an ultrasonic transducer may reflect at an upper surface of a material to be cleaned and enter an ultrasonic transducer through an ultrasonic lens.

When an ultrasonic wave enters an ultrasonic transducer, the ultrasonic transducer is extremely heated exceeding the cooling effect of a cooling liquid then, the polarization of the ultrasonic transducer may be deteriorated. In this case, the ultrasonic transducer cannot generate an ultrasonic wave with a constant intensity, and decreases the cleaning efficiency.

On the other hand, in the ultrasonic cleaning apparatus in which a bar-shaped ultrasonic lens is provided parallel to a material to be cleaned and an ultrasonic transducer is provided at one end of the lens, an ultrasonic wave transmission route is not straight, and an ultrasonic wave reflected on the material hardly reaches the ultrasonic transducer.

However, in this ultrasonic cleaning apparatus, the ultrasonic wave generated by the ultrasonic transducer is applied to the cleaning liquid after converting to vibration in the lateral direction of the ultrasonic lens, and the intensity of the ultrasonic wave applied to the cleaning liquid is decreased. Further, since the vibration in the lateral direction of the ultrasonic lens advances radially around the axial line of the ultrasonic lens, or toward all directions of the radius of the ultrasonic lens, the ultrasonic vibration toward the upper side where no cleaning liquid exists is not effectively used for cleaning the material.

BRIEF SUMMARY OF THE INVENTION

According to an aspect of the present invention, there is provided an ultrasonic cleaning apparatus comprising an ultrasonic wave application head which cleans a material at a surface by applying an ultrasonic wave to a cleaning liquid supplied to the surface of the material. The ultrasonic wave application head has an ultrasonic wave transmission member which is placed opposite to the surface and has a curved portion on a first plane placed close to the surface; an ultrasonic transducer which is provided on a second plane opposite to the first plane of the ultrasonic transmission member, and generates and applies an ultrasonic wave to a cleaning liquid on the surface through the ultrasonic wave transmission member; and a preventive portion which is provided in the ultrasonic wave transmission member, and prevents the ultrasonic wave applied to the cleaning liquid and reflected on the surface from entering the ultrasonic transducer through the ultrasonic wave transmission member.

According to another aspect of the present invention, there is provided an ultrasonic cleaning apparatus comprising an ultrasonic wave application head which cleans a material at a surface by applying an ultrasonic wave to a cleaning liquid supplied to the surface of the material. The ultrasonic wave application head has an ultrasonic wave transmission member which is placed opposite to the surface and has a curved portion on a first plane placed close to the surface; an ultrasonic transducer which is provided on a second plane opposite to the first plane of the ultrasonic transmission member, and generates and applies an ultrasonic wave to the liquid on the surface through the first plane of the ultrasonic wave transmission member; and a preventive portion which is provided in the ultrasonic wave transmission member, and prevents the ultrasonic wave generated by the ultrasonic transducer from exiting to the cleaning liquid on the surface at a substantially right angle to the surface.

According to another aspect of the present invention, there is provided an ultrasonic cleaning apparatus comprising an ultrasonic wave application head which cleans a material at a surface by applying an ultrasonic wave to a cleaning liquid supplied to the surface of the material. The ultrasonic wave application head has a cylindrical ultrasonic wave transmission member with a first plane faced to the surface, and an ultrasonic transducer which is provided on a second plane opposite to the first plane of the ultrasonic wave transmission member, and applies an ultrasonic wave to the cleaning liquid on the surface through the ultrasonic wave transmission member, wherein a portion of the first plane of the ultrasonic wave transmission member closest to the surface is circular surrounding the axial line of the ultrasonic wave transmission member.

According to another aspect of the present invention, there is provided an ultrasonic cleaning apparatus comprising an ultrasonic wave application head which cleans a material at a surface by applying an ultrasonic wave to a cleaning liquid supplied to the surface of the material. The ultrasonic wave application head has a bar-shaped ultrasonic wave transmission member which is placed with an axial line parallel to the surface and a first plane faced to the surface; and an ultrasonic transducer which is provided on a second plane opposite to the first plane of the ultrasonic transmission member, and generates and applies an ultrasonic wave to a cleaning liquid on the surface through the ultrasonic wave transmission member, wherein a portion of the first plane of the ultrasonic wave transmission member closest to the surface is formed as two linear lines which are located on both sides of a axial line of the ultrasonic wave transmission member respectively.

According to the aspects of the present invention, a high cleaning efficiency can be obtained.

Additional aspects and advantages of the invention will be set forth in the description which follows, and in part will be obvious from the description, or may be learned by practice of the invention. The aspects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3A is a graph showing the intensity distribution of an ultrasonic wave measured under an ultrasonic lens with a notch according to the embodiment;

FIG. 3B is a graph showing the intensity distribution of an ultrasonic wave measured under an ultrasonic lens without a notch according to the embodiment;

FIG. 5 is a graph showing the temperatures of an ultrasonic transducer according to the embodiment measured by supplying power continuously to the ultrasonic transducer;

FIG. 6 is a graph showing the temperatures of an ultrasonic transducer according to the embodiment measured by supplying power intermittently to the ultrasonic transducer;

FIG. 9 is a perspective view of an ultrasonic cleaning apparatus according to a second embodiment of the present invention; and FIG. 10 is a perspective view of an ultrasonic lens according to a modification of the embodiment.

DETAILED DESCRIPTION OF THE INVENTION

Description will be given of the best mode for carrying out the present invention.

Embodiment 1

A first embodiment of the present invention will be explained first with reference to FIG. 1-FIG. 8.

[Configuration of Ultrasonic Cleaning Apparatus]

Figure 1:
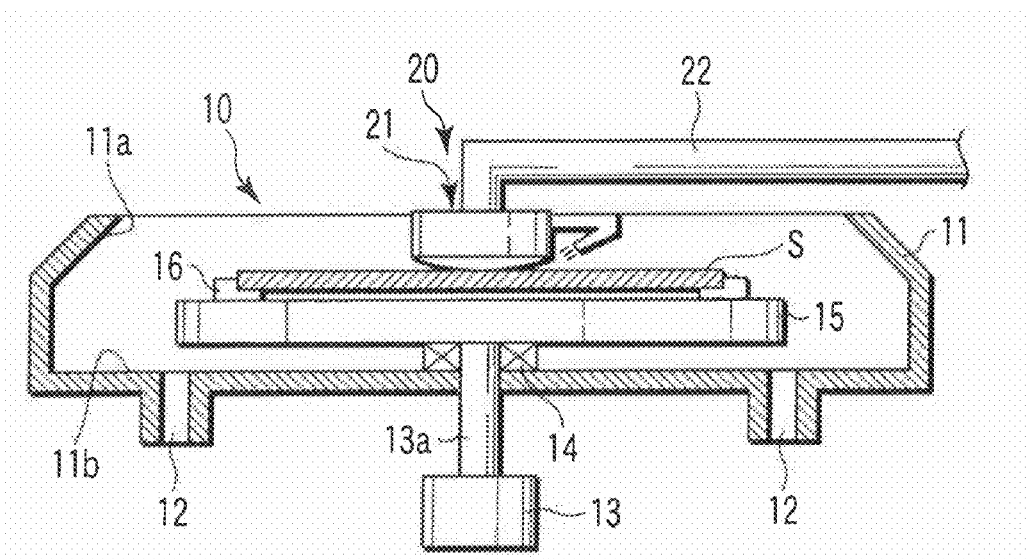
FIG. 1 is a view showing the configuration of an ultrasonic cleaning apparatus according to a first embodiment of the present invention.

FIG. 1 is a view showing the configuration of an ultrasonic cleaning apparatus according to a first embodiment of the present invention.

As shown in FIG. 1, the ultrasonic cleaning apparatus comprises a spin processing unit 10 which holds and rotates a material S such as a semiconductor substrate and glass substrate, and an ultrasonic cleaning unit 20 which supplies a cleaning liquid L to the material S, applies an ultrasonic wave to the cleaning liquid L, and cleans the surface of the material S.

The spin processing unit 10 has a cylindrical cup body 11 with a bottom. The cup body 11 has an opening 11a facing upward, and has ejection ports 12 on the bottom 11b to eject the cleaning liquid L after the cleaning step.

A motor 13 is provided under the cup body 11. A driving shaft 13a of the motor 13 penetrates the bottom wall of the cup body 11, and the mid portion of the shaft 13a is rotatably held by a bearing 14.

A rotary table 15 is provided almost horizontally at the upper end of the driving shaft 13a. Support pins 16 are provided with equal intervals on the upper surface periphery of the rotary table 15. The support pins 16 engage with the periphery of the material S, and support the material S substantially horizontally.

The ultrasonic cleaning unit 20 has an ultrasonic wave application head 21. The ultrasonic wave application head 21 is placed opposite to the surface of the material S, and can reciprocate on the surface by driving a swing arm 22.

[Configuration of Ultrasonic Wave Application Head 21]

Figure 2:
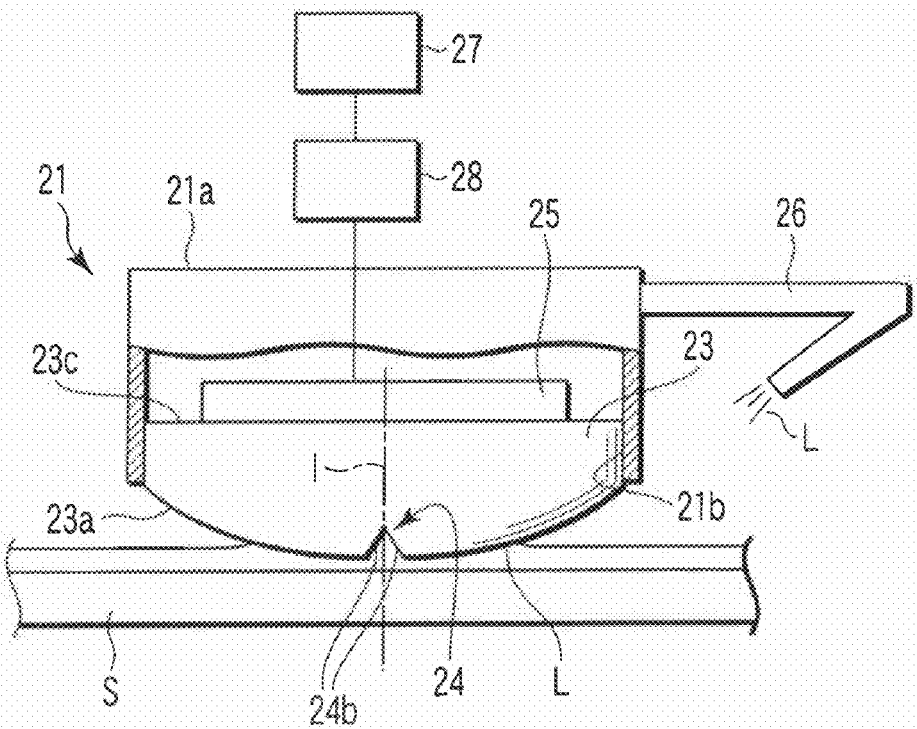
FIG. 2 is a view showing the configuration of an ultrasonic wave application head according to the embodiment.

FIG. 2 is a view showing the configuration of the ultrasonic wave application head 21 according to the embodiment.

As shown in FIG. 2, the ultrasonic wave application head 21 has a head main body 21a. The head main body 21a is formed like a flat plate, and has an opening 21b faced to the surface of the material S.

A cylindrical ultrasonic lens 23 (ultrasonic transmission member) is provided inside the head main body 21a. The ultrasonic lens 23 is made of SiO2, for example. The lower end of the ultrasonic lens 23 projects from the opening 21b of the head main body 21a to the surface of the material S. The lower end face 23a (first plane) opposite to the surface of the material S is composed of a curved portion projecting to the surface as it comes close to the radial center.

The vertical thickness of the ultrasonic lens 23 is set to have the highest intensity of an ultrasonic wave generated by an ultrasonic transducer 25 (described later) in the ring-like area around an axial line I of the ultrasonic lens 23 when the intensity is measured under the ultrasonic lens 23.

A notch 24 (preventive portion) is formed at the radial center of the lower end face 23a of the ultrasonic lens 23. The notch 24 is formed by oblique planes 24b inclined to the axial line I of the ultrasonic lens 23, and formed conical with the diameter becoming small as it goes upward in this embodiment.

As the notch 24 is formed in the ultrasonic lens 23 as described above, the circular area around the axial line I of the lower end face 23a of the ultrasonic lens 23 becomes closest to the material S.

The ultrasonic transducer 25 is fixed with adhesive to the upper end face 23c (second surface) of the ultrasonic lens 23. The ultrasonic transducer 25 is made of lead titanate, for example, and generates an ultrasonic wave by receiving power from a power supply unit 27. The ultrasonic transducer 25 may also be made of piezoelectric element.

A matching circuit 28 is provided between the power supply unit 27 and ultrasonic transducer 25. The matching circuit 28 matches the impedance between the power supply unit 27 and ultrasonic transducer 25, and is previously adjusted to convert the power from the power supply unit 27 most effectively into an ultrasonic wave in the ultrasonic transducer 25.

A nozzle body 26 is provided in the periphery of the head main body 21a. The distal end of the nozzle body 26 is faced to between the lower end face 23a of the ultrasonic lens 23 and the surface of the material S, so that it can supply the cleaning liquid L such as hydrofluoric acid to the surface of the material S.

A cooling tube (not shown) is provided around the ultrasonic lens 23. The cooling tube flows a cooling liquid supplied from a cooling liquid source (not shown), and can cool the ultrasonic transducer 25 heated by generating an ultrasonic wave.

[Effects of Ultrasonic Cleaning Apparatus]

Description will now be given on the effects when the ultrasonic cleaning apparatus configured as described above is used.

When the material S is supported by the support pins 16 on the rotary table 15, the material S is rotated in the circumferential direction by the rotary table 15 and the cleaning liquid L is supplied from the nozzle body 26 to the surface of the material S.

When the cleaning liquid L is filled between the ultrasonic lens 23 and the surface of the material S, the ultrasonic transducer 25 is driven and an ultrasonic wave is applied from the ultrasonic lens 23 to the cleaning liquid L on the surface of the material S.

Among the ultrasonic waves applied to the cleaning liquid L, those applied to the cleaning liquid L through the radial center of the ultrasonic lens 23 are refracted at the notch 24 formed on the lower end face 23a of the ultrasonic lens 23.

Thus, the ultrasonic wave is difficult to reach the cleaning liquid L near the radial center of the ultrasonic lens 23. As a result, the intensity of the ultrasonic wave applied to the cleaning liquid L is decreased near the radial center of the ultrasonic lens 23, compared with that in the surrounding area.

Among the ultrasonic waves applied to the cleaning liquid L, those applied to the cleaning liquid L not through the radial center of the ultrasonic lens 23 are refracted radially around the axial line of the ultrasonic lens 23 on the curved surface formed on the lower end face 23a of the ultrasonic lens 23, and applied to a wide area of the cleaning liquid L.

Namely, the ultrasonic wave generated by the ultrasonic transducer 25 is prevented from exiting from the ultrasonic lens 23 substantially perpendicular to the surface of the material S, by the notch 24 and curved surface formed on the lower end face 23a of the ultrasonic lens 23.

FIG. 3A is a graph showing the intensity distribution of the ultrasonic wave measured under the ultrasonic lens 23 with the notch 24 according to the embodiment. FIG. 3B is a graph showing the intensity distribution of the ultrasonic wave measured under the ultrasonic lens 23 without the notch 24 according to the embodiment. In FIG. 3, the solid line indicates an RMS value, the chain line indicates a peak value, and the dotted line indicates the radial center of the ultrasonic lens 23.

The measuring conditions are as follows.

Generation frequency of ultrasonic wave: 1685 [kHz]
Cleaning liquid: Deaerated water
Power supplied to the ultrasonic transducer 25: 15 [W]
Output waveform of ultrasonic wave: Continuous wave According to FIG. 3A and FIG. 3B, it is seen that the intensity of an ultrasonic wave is decreased near the radial center of the ultrasonic lens 23 by providing the notch 24 at the radial center on the lower end face 23a of the ultrasonic lens 23.

Figure 4A:
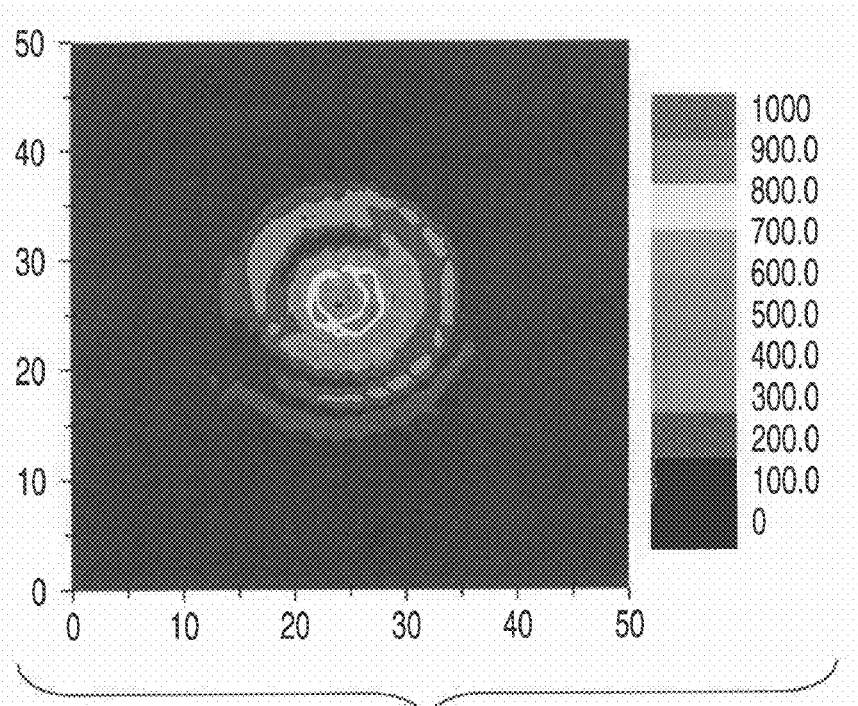
FIG. 4A is gradation showing the intensity distribution of an ultrasonic wave measured under an ultrasonic lens with a notch according to the embodiment.
Figure 4B:
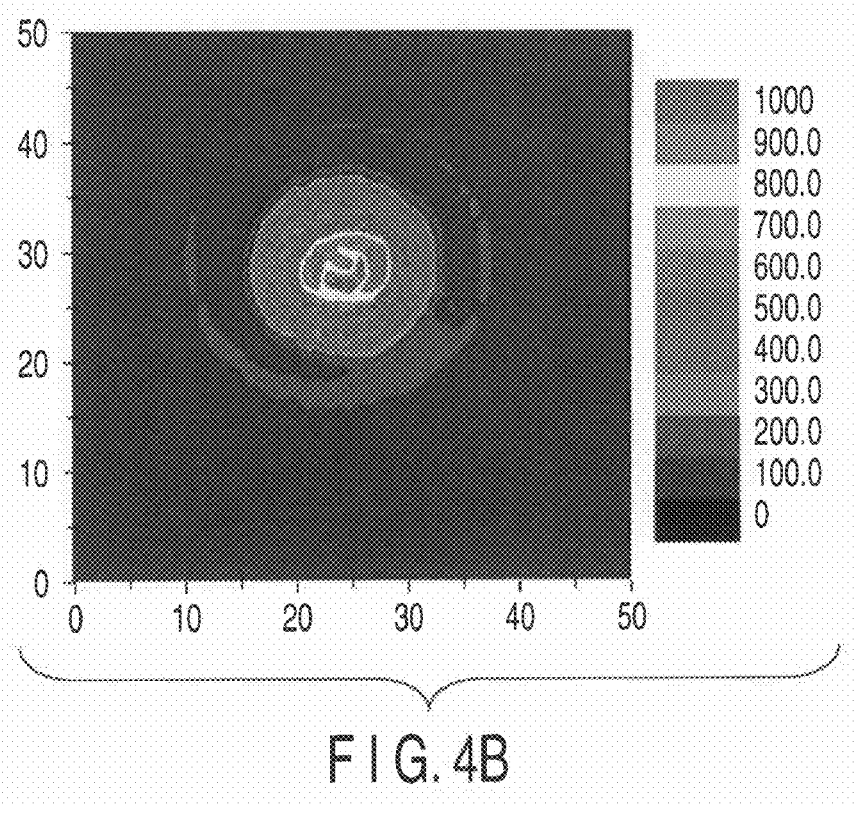
FIG. 4B is gradation showing the intensity distribution of an ultrasonic wave measured under an ultrasonic lens without a notch according to the embodiment.

FIG. 4A is gradation showing the intensity distribution of the ultrasonic wave measured under the ultrasonic lens 23 with the notch 24 according to the embodiment. FIG. 4B is gradation showing the intensity distribution of the ultrasonic wave measured under the ultrasonic lens 23 without the notch 24 according to the embodiment.

The measuring conditions are as follows.
Generation frequency of ultrasonic wave: 1685 [kHz]
Cleaning liquid: Deaerated water
Power supplied to the ultrasonic transducer 25: 15 [W]
Measuring range: Square of 50×50 [mm]

According also to FIG. 4A and FIG. 4B, it is seen that the intensity of an ultrasonic wave is decreased near the radial center of the ultrasonic lens 23 by providing the notch 24 at the radial center on the lower end face 23a of the ultrasonic lens 23. It is also seen that the intensity of an ultrasonic wave is increased in the circular area around the radial center of the ultrasonic lens 23 by adjusting the vertical thickness of the ultrasonic lens 23.

The ultrasonic wave applied to the cleaning liquid L is reflected on that surface of the material S and transmitted to the ultrasonic lens 23 (this ultrasonic wave is called a reflected wave hereinafter).

Among the ultrasonic waves reflected on the surface, those transmitted through the position out of the radial center of the ultrasonic lens are reflected outside the radial direction of the ultrasonic lens 23 on the curved surface formed on the lower end face 23a of the ultrasonic lens 23, and most of them do not enter the ultrasonic lens 23.

Among the ultrasonic waves reflected on the surface, those transmitted through the radial center of the ultrasonic lens 23 are reflected at the notch 24 formed on the lower end face 23a of the ultrasonic lens 23, and most of them do not reach the ultrasonic transducer 25. Even if a part of the reflected wave enters the ultrasonic lens 23, it is refracted when passing thorough the notch 24 and hardly enter the ultrasonic transducer 25 on the ultrasonic lens 23.

Namely, the ultrasonic wave reflected on the surface is prevented from entering the ultrasonic lens 23 through the ultrasonic lens 23, by the notch 24 and curved surface formed on the lower end face 23a of the ultrasonic lens 23.

Thus, the ultrasonic transducer 25 is not extremely heated by absorbing a reflected wave, deterioration of polarization is suppressed, and stable cleaning effect can be obtained for a long period of time.

FIG. 5 is a graph showing the temperatures of the ultrasonic transducer 25 according to the embodiment measured by supplying power continuously to the ultrasonic transducer 25.

In FIG. 5, the solid line indicates the case when the notch 24 is formed in the ultrasonic lens 23, and the chain line indicates the case when the notch 24 is not formed. The sign A indicates the case when power of 10 [W] is supplied to the ultrasonic transducer 25, B indicates the case when power of 20 [W] is supplied to the ultrasonic transducer 25, and C indicates the case when power of 30 [W] is supplied to the ultrasonic transducer 25, respectively.

The measuring conditions are as follows.
Generation frequency of ultrasonic wave: 1685 [kHz]
Cleaning liquid: Deaerated water
Measuring position: Center of the ultrasonic transducer
Sampling: 1 [sec]

Comparing the solid line and chain line in FIG. 5, it is seen in any case of A-C that the temperature of the ultrasonic transducer 25 when the notch 24 is formed in the ultrasonic lens 23 is lower than the case when the notch 24 is not formed.

FIG. 6 is a graph showing the temperatures of the ultrasonic transducer 25 according to the embodiment measured by supplying power intermittently to the ultrasonic transducer 25. In FIG. 6, the solid line indicates the case when the notch 24 is formed in the ultrasonic lens 23, and the chain line indicates the case when the notch 24 is not formed.

The measuring conditions are as follows.
Generation frequency of ultrasonic wave: 1685 [kHz]
Cleaning liquid: Deaerated water
Power supplied to the ultrasonic transducer 25: 20 [W]
Measuring position: Center of the ultrasonic transducer 25
Sampling: 1 [sec]

Comparing the solid line and chain line in FIG. 6, it is seen that the temperature of the ultrasonic transducer 25 when the notch 24 is formed on the lower end face 23a of the ultrasonic lens 23 is about 20% lower than the case when the notch 24 is not formed.

According to this experiment, it is seen that even if the ultrasonic transducer 25 is intermittently driven as when actually cleaning the material S by using the ultrasonic cleaning apparatus, the temperature of the ultrasonic transducer 25 is hardly increased when the notch 24 is formed on the lower end face 23a of the ultrasonic lens 23, compared with the case when the notch 24 is not formed.

Besides, if the ultrasonic wave reflected on the surface of the material S is hardly enter the ultrasonic transducer 25 as in this embodiment, the impedance matching between the ultrasonic transducer 25 and power supply unit 27 is not disturbed by the reflected wave. Thus, the ultrasonic transducer 25 is driven with the matching circuit 28 kept in the optimum matching state by initial setting, and a desired cleaning effect can be held.

Figure 7:
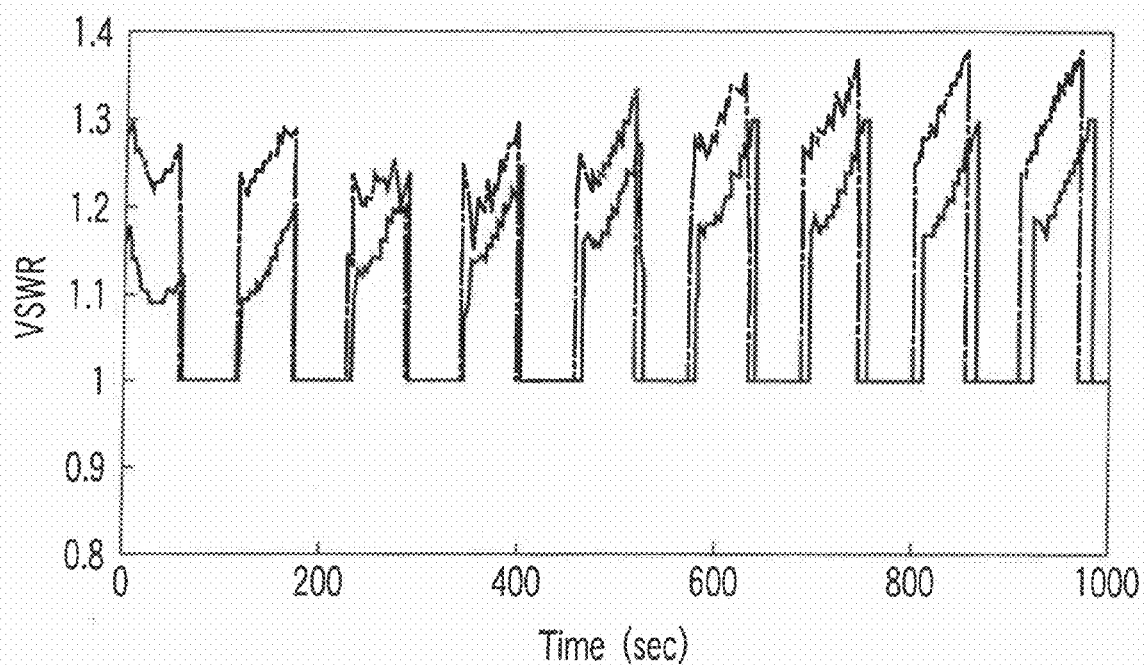
FIG. 7 is a graph showing the voltage standing wave ratio VSWR when power is continuously supplied to the ultrasonic transducer according to the embodiment.

FIG. 7 is a graph showing the voltage standing wave ratio VSWR when power is continuously supplied to the ultrasonic transducer 25 according to the embodiment. In FIG. 7, the solid line indicates the case when the notch 24 is formed in the ultrasonic lens 23, and the chain line indicates the case when the notch 24 is not formed.

Comparing the solid line and chain line in FIG. 7, it is seen that the voltage standing wave ratio VSWR when the notch 24 is formed one the lower end face 23a of the ultrasonic lens 23 is lower than the case when the notch 24 is not formed. This indicates that the power supplied from the power supply unit 27 is effectively converted to an ultrasonic wave in the ultrasonic transducer 25.

Modification of the Embodiment

Figure 8:
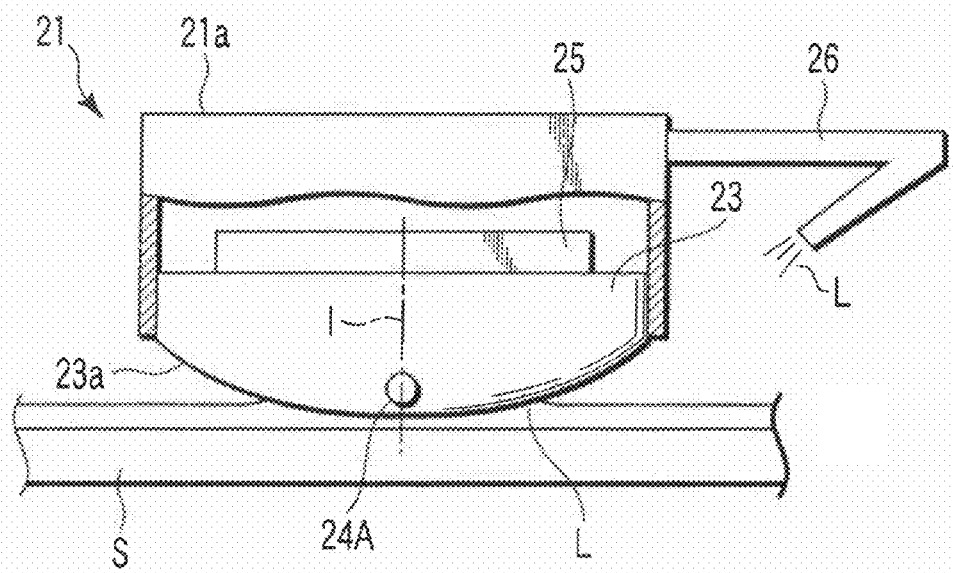
FIG. 8 is a view showing the configuration of an ultrasonic wave application head according to a modification of the embodiment.

FIG. 8 is a view showing the configuration of an ultrasonic wave application head 21A according to a modification of the embodiment. As shown in FIG. 8, a space 24A is taken on the axial line I of the ultrasonic lens 23 in this modification, instead of forming the notch 24 on the lower end surface 23a of the ultrasonic lens 23.

Even with this configuration, the ultrasonic wave generated by the ultrasonic transducer 25 is prevented from being applied to the cleaning liquid L through the radial center of the ultrasonic lens 23, and the ultrasonic wave reflected on the surface is prevented from entering the ultrasonic transducer 25 through the ultrasonic lens 23.

It is permitted to bury rubber or similar material on the axial line I of the ultrasonic lens 23, instead of taking the space 24A. The material should not be molten when absorbing an ultrasonic wave.

Embodiment 2

A second embodiment of the present invention will be explained with reference to FIG. 9 and FIG. 10. The same components and effects as those of the first embodiment will be omitted.

[Configuration of Ultrasonic Cleaning Apparatus]

FIG. 9 is a perspective view of an ultrasonic cleaning apparatus according to a second embodiment of the present invention.

As shown in FIG. 9, the ultrasonic cleaning apparatus according to this embodiment comprises a conveying unit 31 which conveys a material S such as a semiconductor substrate and glass substrate, and an ultrasonic wave application head 32 which supplies a cleaning liquid L to the material S conveyed by the conveying unit 31, applies an ultrasonic wave to the cleaning liquid L, and cleans the surface of the material S.

[Configuration of Ultrasonic Wave Application Head 32]

The ultrasonic wave application head 32 has a head man body 32a. The head main body 32a is formed like a long plate, and has an opening 32b faced to the surface of the material S.

A bar-shaped ultrasonic lens 33 is provided horizontally inside the head main body 21a. The ultrasonic lens 33 is made of SiO2, for example. The lower end of the ultrasonic lens 33 projects from the opening 32b of the head main body 32a to the surface of the material S. The lower end face 33a opposite to the surface of the material S is composed of a curved portion projecting to the surface of the material S as it comes close to the radial center.

The vertical thickness of the ultrasonic lens 33 is set to have the highest intensity of an ultrasonic wave generated by an ultrasonic transducer 35 (described later) in the belt-like two areas located on both sides of the center in the width direction of the ultrasonic lens 33 respectively when the intensity is measured under the ultrasonic lens 33.

A notch 34 (preventive portion) is formed along the axial line m of the ultrasonic lens 33, at the radial center of the lower end face 33a of the ultrasonic lens 33. The notch 34 is formed by two oblique planes 34b inclined to the surface of the material S, and formed like a wedge with the diameter becoming small as it goes upward in this embodiment.

As the notch 34 is formed in the ultrasonic lens 33 as described above, two linear areas which are located on both sides of the center of the width direction of the ultrasonic lens 33 become closest to the material S.

The ultrasonic transducer 35 is fixed with adhesive to the upper end face 33b of the ultrasonic lens 33. The ultrasonic transducer 35 is made of lead titanate, for example, and generates an ultrasonic wave by receiving power from a power supply unit 37. The ultrasonic transducer 35 may also be made of piezoelectric element.

A matching circuit 38 is provided between the power supply unit 37 and ultrasonic transducer 35. The matching circuit 38 matches the impedance between the power supply unit 37 and ultrasonic transducer 35, and is previously adjusted so that the power from the power supply unit 37 is most effectively converted to an ultrasonic wave in the ultrasonic transducer 35.

A cooling tube (not shown) is provided around the ultrasonic lens 33. The cooling tube is connected to a cooling liquid supply source (not shown), flows a cooling liquid from the cooling liquid source, and cools the ultrasonic transducer 35 heated by generating an ultrasonic wave.

The same effects of the first embodiment can be obtained, even if the notch 34 is formed in the lower end face 33a of the bar-shaped ultrasonic lens 33 as in this embodiment.

Modification of the Embodiment

FIG. 10 is a perspective view of an ultrasonic lens according to a modification of the embodiment. As shown in FIG. 10, an elliptical space 34A (preventive portion) passing through the center of width direction is taken inside the ultrasonic lens 23 in this modification, instead of forming the notch 34 on the lower end surface 33a of the ultrasonic lens 33.

Even with this configuration, the ultrasonic wave generated by the ultrasonic transducer 35 is prevented from being applied to the cleaning liquid L through the center of width direction of the ultrasonic lens 33, and the ultrasonic wave reflected on the surface of the material S is prevented from entering the ultrasonic transducer 35 through the ultrasonic lens 33.

It is permitted to bury rubber or similar material, instead of taking the space 34A. The material should not be molten when absorbing an ultrasonic wave.

The present invention is not limited to the above-mentioned embodiments. The invention may be embodied by modifying the components without departing from its essential characteristics. The invention may also be embodied in various forms by combining the components disclosed in the above-mentioned embodiments. For example, some components may be deleted from the components used in the above-mentioned embodiments. It is also possible to combine the components which are used in different embodiments.

For example, the ultrasonic transducer 25 may be provided at the position other than on the upper end face 33b of the ultrasonic lens 23, and the ultrasonic wave generated by the ultrasonic transducer 25 may be reflected on the reflection surface provided in the ultrasonic lens 23 and applied to the cleaning liquid L on the surface of the material. Even with this configuration, the same effects as the above-mentioned embodiments can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic cleaning apparatus comprising an ultrasonic wave application head which cleans a material at a surface by applying an ultrasonic wave to a cleaning liquid supplied to the surface, the ultrasonic wave application head comprising:

a cylindrical ultrasonic wave transmission member, a longitudinal axis of the ultrasonic wave transmission member is configured to be placed perpendicular to the surface to be supplied with the cleaning liquid, the cylindrical ultrasonic wave transmission member having a first end portion including a curved portion to project to the surface, the curved portion having an annular portion surrounding the longitudinal axis of the ultrasonic wave transmission member in a portion closest to the surface;

an ultrasonic transducer which is provided on a second end portion over the first end portion of the ultrasonic wave transmission member, and applies an ultrasonic wave to the cleaning liquid on the surface through the ultrasonic wave transmission member; and a preventive portion which is provided in the annular portion at a radial center of the first end portion of the ultrasonic wave transmission member and along the longitudinal axis of the ultrasonic wave transmission member, the preventive portion preventing the ultrasonic wave from passing, wherein the preventive portion is a notch formed on the first end portion of the ultrasonic wave transmission member, and the notch is formed by oblique planes inclined to the surface, and wherein the preventive portion is conical.

2. The ultrasonic cleaning apparatus according to claim 1, wherein the preventive portion is provided inside the ultrasonic wave transmission member.

3. The ultrasonic cleaning apparatus according to claim 2, wherein the preventive portion is made of rubber.

4. The ultrasonic cleaning apparatus according to claim 2, wherein the preventive portion is hollow.

\* \* \* \* \*